United States Patent [19]

Autrey et al.

[11] Patent Number: 4,616,231
[45] Date of Patent: Oct. 7, 1986

[54] NARROW-BAND BEAM STEERING SYSTEM

[75] Inventors: Samuel W. Autrey, Fullerton; Harold G. Drab, Long Beach, both of Calif.

[73] Assignee: Hughes Aircraft Company, Los Angeles, Calif.

[21] Appl. No.: 593,155

[22] Filed: Mar. 26, 1984

[51] Int. Cl.<sup>4</sup> ............................................... H01Q 3/12
[52] U.S. Cl. .................................. 342/374; 342/368; 342/371; 342/383
[58] Field of Search ............... 343/371, 372, 373, 374, 343/383, 424, 442, 417, 368; 367/119, 121, 123, 124, 125, 126

[56] References Cited

U.S. PATENT DOCUMENTS

| 3,002,188 | 9/1961 | Abbott | 367/123 |
| 3,670,355 | 6/1972 | Hirsch | 367/126 |
| 3,863,258 | 1/1975 | Clark | 343/424 |
| 3,905,009 | 9/1975 | Hughes et al. | 367/121 |
| 3,909,751 | 9/1975 | Tang et al. | |
| 4,228,531 | 10/1980 | Bogert et al. | 367/121 |
| 4,484,358 | 11/1984 | Iwahashi | 455/213 |
| 4,532,515 | 7/1985 | Cantrell et al. | 343/424 |

FOREIGN PATENT DOCUMENTS

| 0047098 | 3/1982 | European Pat. Off. | |
| 0065219 | 11/1982 | European Pat. Off. | |
| 3118198 | 11/1982 | Fed. Rep. of Germany | |
| 2022256 | 12/1979 | United Kingdom | 367/121 |

OTHER PUBLICATIONS

International Search Report for PCT/US/00248, dated Jun. 7, 1985.
J. J. Brady, "A Narrow-Band Phase Shift Beamformer Suitable for Integrated Circuit Implementation," J. Acoustical Soc. America, vol. 67, No. 3, pp. 1065-1077.
J. T. Caves et al., "Sampled Analog Filtering Using Switch and Capacitors as Resistor Equivalents," IEEE Journal of Solid-State Cir., vol. SC12, No. 6, Dec. 1977, pp. 592-599.

Primary Examiner—Theodore M. Blum
Assistant Examiner—David Cain
Attorney, Agent, or Firm—Robert Thompson; A. W. Karambelas

[57] ABSTRACT

A narrow-band phase shift beamformer system is disclosed. The outputs from the elements in a transducer array are each divided into two components whose amplitudes are respectively proportional to the sine and cosine of the required phase shift, which are then processed so that the steered beam may be formed by coherent summation. The proportionalities of the respective sine and cosine components are achieved by switched capacitor circuits, which are preferably implemented by LSI circuits, permitting substantial hardware savings and yielding highly accurate component proportionalities.

16 Claims, 5 Drawing Figures

NARROW-BAND BEAM STEERING SYSTEM

BACKGROUND OF THE INVENTION

1. Field of the Invention

The field of the present invention is acoustic and electromagnetic beam formation, and more particularly, phase shift beamformers for transducer arrays operating on narrow-band signals.

2. Description of the Prior Art

It is known that electromagnetic antennas or acoustic hydrophone arrays may be steered by phase shift systems. U.S. Pat. No. 3,002,188 discloses a beam steering system comprising two transformer elements coupled to each transducer element to split the transducer output into two components, one having an amplitude proportional to the cosine of the phase shift to be introduced, the other having an amplitude proportional to the sine of the phase shift. The respective cosine and sine components of all of the array elements may then be coherently summed to form composite component values, each substantially equal in power to the power induced in one of the transducer elements times ½ the number of elements. These two signals are phase shifted by 90° relative to each other and passed through a summation network to yield an output signal whose power is substantially equal to the power induced in any one transducer in the array times the number of transducers. An alternate embodiment utilizes a discrete capacitive matrix to realize the desired proportionalities in the sine and cosine components.

While the system disclosed in U.S. Pat. No. 3,002,188 operates in a satisfactory manner, it has certain drawbacks. For example, the transformer (or discrete capacitive matrix) network is quite bulky and relatively expensive to fabricate, and the accuracies of the element gains and phases are somewhat limited. These drawbacks are to some extent addressed by utilizing a resistive element phase compensator system such as is described, for example, in the Navy Electronics Laboratory Report 1148, "Simultaneous Multibeam Phase Compensation: X1, A Resistive-Element Phase Compensator," by L. D. Morgan and R. D. Strait, Dec. 4, 1962. However, even the resistive-element systems require a significant number of discrete elements, so that the beam steering system is still quite bulky. Moreover, the accuracies of the component gains and phases are still limited.

Unrelated to phase-shift beamformers, there has been extensive recent application of switched capacitors to LSI filters. Two examples of papers discussing the subject are "MOS Switched-Capacitor Filters," by R. W. Broderson, P. R. Gray and D. A. Hodges, *Proceedings of the IEEE*, Vol. 67, No. 1, January 1979, pp. 61–75, and "Applications of CCD and Switched Capacitor Filter Technology," by C. R. Hewes, R. W. Broderson and D. D. Buss, *Proceedings of the IEEE*, Vol. 67, No. 10, October 1979, pp. 1403–1415.

It is an object of the present invention to provide a phase shift beam steering system which achieves substantial reduction in required hardware over previous systems.

It is another object of the present invention to provide a beam steering system which may be fabricated on LSI chips.

A further object of the invention is to provide a phase shift beamformer whose respective phase shifts may be realized to a high degree of accuracy.

It is yet another object of the present invention to provide a beam steering system wherein the proportionality between signal components is achieved by utilization of switched capacitors.

Another object of the invention is to provide a beam steering system wherein the respective signal component ratios remain substantially constant over a wide range of system operating conditions.

SUMMARY OF THE INVENTION

The present invention comprises a phase shift beamformer system operating in the time domain on narrowband signals and implemented with switched capacitors. The system operates on the outputs of a transducer array to form a large number of beams simultaneously, with each beam steered to a different direction, and with the total set of beams providing the complete solid angle coverage desired. To steer any particular beam, the output of each array element is divided into two components, one proportional to the sine of the desired phase shift, and the other component being made proportional to the cosine of the desired phase shift for that element. The components are then phase shifted by 90° with respect to each other and summed to yield the element output, allowing coherent addition with other element outputs to form the beam at the chosen steering angle. Switched capacitors are employed to achieve the desired component proportionalities, which can also include a factor proportional to shading coefficients for sidelobe control. The beamformer can be implemented on LSI chips, resulting in very substantial hardware savings. In addition, the achievable accuracies on the individual element gains and phases are significantly better than those of prior art analog implementations.

BRIEF DESCRIPTION OF THE DRAWINGS

The various objects, features and advantages of the disclosed invention will be readily appreciated by persons skilled in the art from the following detailed disclosure when read in conjunction with the accompanying drawings, wherein.

DETAILED DESCRIPTION OF THE INVENTION

The present invention comprises a novel narrowband beam steering system. The following description of the invention is provided to enable any person skilled in the art to make and use the invention. Various modifications to the disclosed embodiment will be readily apparent to those skilled in the art, and the generic principles defined herein may be applied to other embodiments. Thus, the present invention is not intended to be limited to the embodiment shown, but is to be accorded the widest scope consistent with the principles and novel features of the invention.

Phase shift beamforming per se is well-known in the art. In an array of transducers (for example, hydrophones used in sonar applications), the electrical signals generated by each element of the array are processed so as to add together coherently, in order to obtain a maximum response to signals from any one direction. For a single frequency signal, the signals from the respective elements in the array are processed so that they add "in-phase" for a particular direction of signal arrival. Signals arriving from other directions are not added "in-phase," so the total array response to the signal arriving from the direction of compensation will be greater than that from any other direction.

Figure 1:
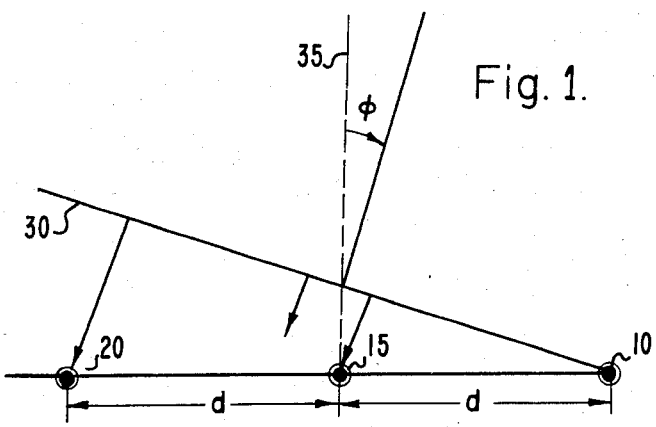
FIG. 1 depicts a planar wave front incident at an angle to an array of transducers.

FIG. 1 depicts a planar wave front 30 of a periodic signal arriving at an angle $\phi$ to the array comprising transducers 10, 15 and 20, uniformly spaced a distance d apart. The wave front 30 arrives at transducer 10 first, at transducer 15 at time T seconds later, and lastly at transducer 20 2T seconds later, where T is the progressive time delay in the medium and is determined by Equation 1.

$$T = \frac{d}{c} \sin \phi \qquad (1)$$

where c is the velocity of propagation of the signal in the medium.

The progressive phase shift 8 of the signal (of angular frequency $\omega$) as it progresses from one transducer to the next is determined by Equation 2.

$$\theta = \omega T = \frac{d}{c} \sin \phi \qquad (2)$$

The phase shift $\theta_1$ of the wave front as it propagates from the first transducer 10 to the second transducer 15, is $\theta$, the phase shift $\theta_2$, from transducer 10 to transducer 20, is $2\theta$, and $\theta_n$ for the Nth transducer is $N\theta$. The phase shift beamformer should be adapted to phase shift the respective transducer signals by $-\theta_n$ in order to coherently add the transducer signals.

Figure 2:
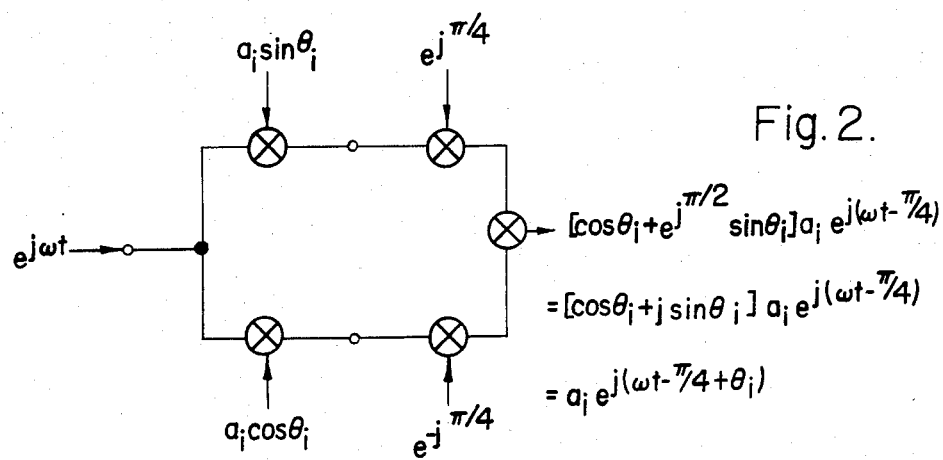
FIG. 2 is a schematic drawing of a circuit illustrating the known technique of phase shift beamforming.

Referring now to FIG. 2, the known technique of phase shift beamforming is illustrated schematically. The input signal $e^{j\omega}t$ is separated into two components. The first component is weighted by the product of the array shading coefficient, $a_i$ for the ith array element, and the sine of the desired phase shift $\theta_i$. The other component is weighted by the product of $a_i$ and the cosine of the phase shift $\theta_i$. The two components are phase shifted by a total of 90° relative to each other and summed, yielding the input signal weighted by $a_i$ and phase shifted by $\theta_i$. The relationships for the output $O_i$ are shown in Equations 3, 4 and 5.

$$O_i = [\cos \theta_i + e^{j\pi/2}\sin \theta_i]a_i e^{j(\omega t - \pi/4)} \qquad (3)$$

$$= [\cos \theta_i + \sin \theta_i]a_i e^{j(\omega t - \pi/4)} \qquad (4)$$

$$= a_i e^{j(\omega t - \pi/4 + \theta_i)} \qquad (5)$$

The constant 90° phase shift will be common to all inputs from each element and hence merely represents a delay to the beam output. Each beam, steered to the predetermined direction $\phi$, is formed by summing the processed array outputs $O_i$ for each array element, each with the appropriate weight $a_i$ and phase shift $\theta_i$, to yield the desired steering angle and sidelobe properties. The structure is then replicated to achieve all of the desired beams.

It is understood that the phase shift is a function of the frequency of the energy induced in the array transducers. Consequently, the phase shift accurately forms the desired beam only in the narrow-frequency band centered at the design wave front frequency.

Figure 3:
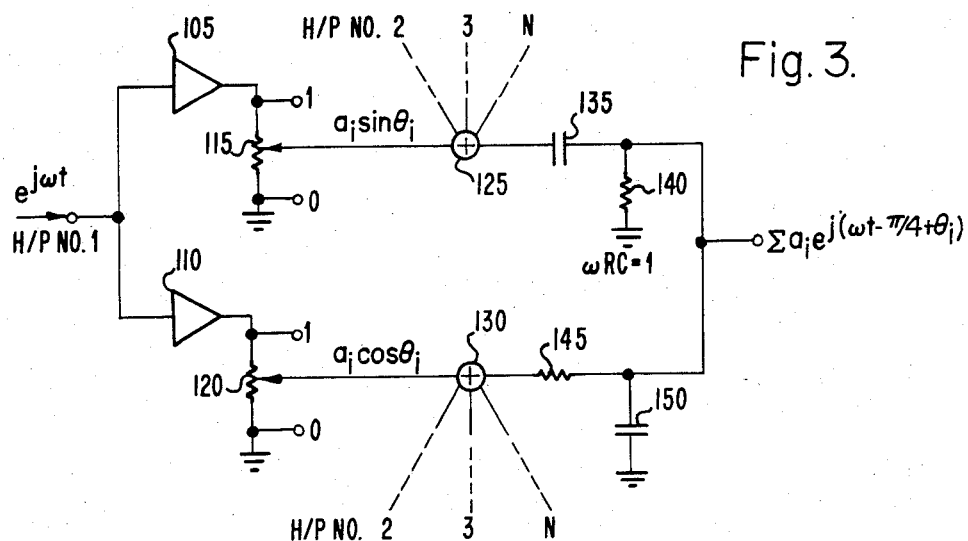
FIG. 3 is a schematic drawing illustrating the formation of a single beam using a resistor matrix to achieve the desired signal component ratios.

FIG. 3 illustrates the known technique of forming a single beam with a resistor network to form the desired component proportionalities. The input signal from the first array element, depicted as "H/P No. 1," is divided and fed into sine and cosine legs or circuit branches, each having respective drivers 105, 110 for driving the respective voltage dividers formed by potentiometers 115, 120. The potentiometers are adjusted so as to provide the appropriate shading and proportionality coefficients $a_i \sin \theta_i$ and $a_i \cos \theta_i$. The weighted inputs from the other array elements, depicted as "H/P No. 2 . . . N," are summed at summing elements 125, 130 before being phase shifted in the R-C networks, one providing a +45° phase shift and the other providing a −45° phase shift. The desired beam is the sum of the two component sums of the respective weighted element contributions.

Figure 4:
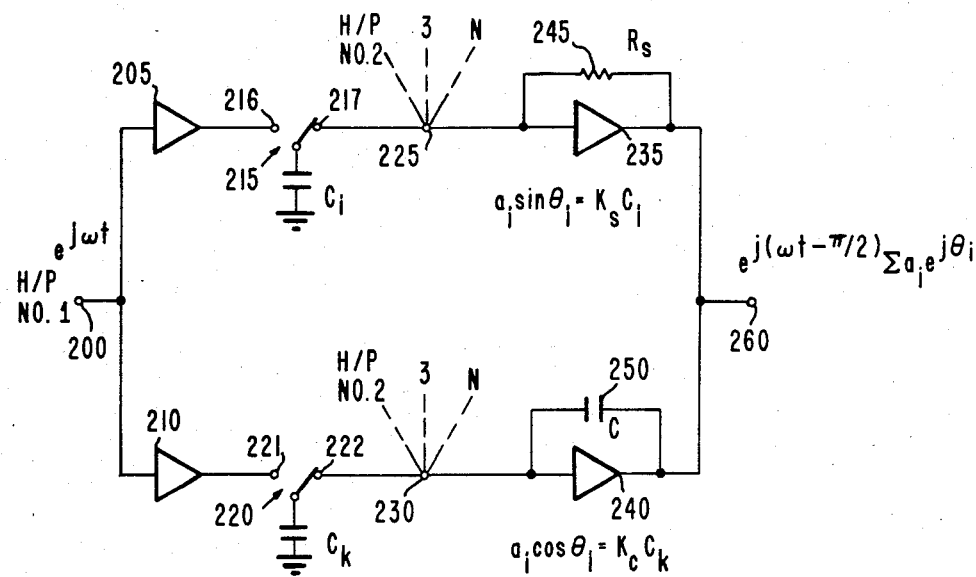
FIG. 4 is a schematic drawing illustrating the sine and cosine circuit branches forming one beam in the preferred embodiment of the invention.

Refering now to FIG. 4, the preferred embodiment of the invention is illustrated. The desired proportionalities between the sine and cosine components are achieved by switched capacitors $C_i$, $C_k$ implemented by large scale integration (LSI) technology. The application of switched capacitor filters to emulate resistive elements is discussed in the literature, for example, "MOS Switched-Capacitor Filters," R. W. Broderson, Paul R. Gray, David A. Hodges, *Proceedings of the IEEE*, Vol. 67, No. 1, January 1979, pp. 61–75, and "Applications of CCD and Switched Capacitor Filter Technology," Charles R. Hews, Robert W. Broderson and Dennis D. Buss, *Proceedings of the IEEE*, Vol. 67, No. 10, October 1979, pp. 1403–1415. These switched capactior circuits utilize a capacitor and MOS transistor switches to simulate the circuit behavior of a resistor. When the switching frequency is much larger than the signal frequencies, the time sampling of the signal can be ignored on a first order basis, and the equivalent resistance of the switched capacitor is given by the relationship of Equation 6.

$$R = 1/Cf_c \qquad (6)$$

where $f_c$ is the clock rate at which the switch is thrown back and forth.

The input signal $e^{j\omega}t$ at node 200 from the first array element, depicted in FIG. 4 as "H/P No. 1," is applied to amplifiers 205 and 210 in the respective sine and cosine branches of the circuit. The outputs of amplifers 205, 210 are respectively coupled at input nodes 216, 221 to the MOS switched capacitor circuits. The MOS switched capacitor circuits are represented schematically by switch 215 and capacitor $C_i$ in the sine branch and by switch 220 and capacitor $C_k$ in the cosine branch.

The proportional sine and cosine branch contributions from the other elements in the array, depicted in FIG. 4 as "H/P No. 2 . . . N," are coupled to summing nodes 225 and 230. Each of these contributions is formed by similar amplifiers and switched capacitor circuits. Nodes 225 and 230 are respectively coupled to the inputs of operational amplifiers 235 and 240, respectively.

The summing circuits of FIG. 4 inherently provide the required relative 90° phase shift between the sine and cosine branches. Operational amplifier 235 with feedback resistor 245 is operated as a unity gain buffer, which does not introduce any phase shift to the input signal. Feedback resistor 245 is preferably implemented by a switched capacitor circuit. Operational amplifier 240 and its feedback capacitor 250 designated as "C" constitute an integrator which inherently introduces a 90° phase shift.

The operational amplifiers 235, 240 provide isolation between the switched capacitors and the circuit output, and a means for converting the charges collected respectively at the amplifier inputs into working voltages at the amplifier outputs. The sum of the outputs of the sine and cosine branches comprises the desired beam output.

The amplifiers comprise gain establishing stages adapted to achieve constant scale factors $K_s$ and $K_c$, such that the desired proportionalities between the sine and cosine circuit branch outputs as expressed in Equations 7 and 8 are achieved.

$$a_i \sin \theta_i = K_s C_i \quad (7)$$

$$a_i \cos \theta_i = K_c C_k \quad (8)$$

Thus, the phase shift $\theta_i$ is related to the ratio of the relative capacitances $C_i$, $C_k$, and scale constants $K_s$, $K_c$.

$$\tan \theta_i = \frac{K_s C_i}{K_c C_k} \quad (9)$$

The constants $K_s$, $K_c$ are utilized as scale factors to accommodate the desired shading factor $a_i$, but also to determine the magnitudes of the capacitances so as to ensure that practical, realizable values are selected.

The switches 215, 220 are implemented by MOS transistors, as is well-known in the art. The switched capacitors, $C_i$ in the sine branch and $C_k$ in the cosine branch, are chosen to be in the desired ratios with the switched capacitors from the other array elements and with each other. For typical input signals in the range of 3 to 5 kHz, a typical switching frequency $f_c$ in the range of 50 to 100 kHz may be used.

These capacitor ratios can be implemented with MOS technology with relatively high accuracy. For example, the above-referenced paper, "MOS Switched Capacitor Filters," describes achievable ratio accuracies ranging from 1–2 percent for small capacitor geometries to on the order of 0.1 percent for capacitor geometries which approach the limit of economical size. These accuracies are extremely high compared to the ratio accuracies achieved in prior art phase beamforming circuits utilizing inductors, resistors or discrete capacitors to achieve the desired proportionalities. Moreover, these ratios remain constant over wide temperature and voltage swings.

The actual implementation of the beamforming circuit may differ slightly from that shown in FIG. 4 to account for parasitic capacitances, slight differences from the relative 90° phase shift, DC stabilization, and accommodation of negative coefficients. The value of resistor 245 is also determined by these implementation considerations.

Figure 5:
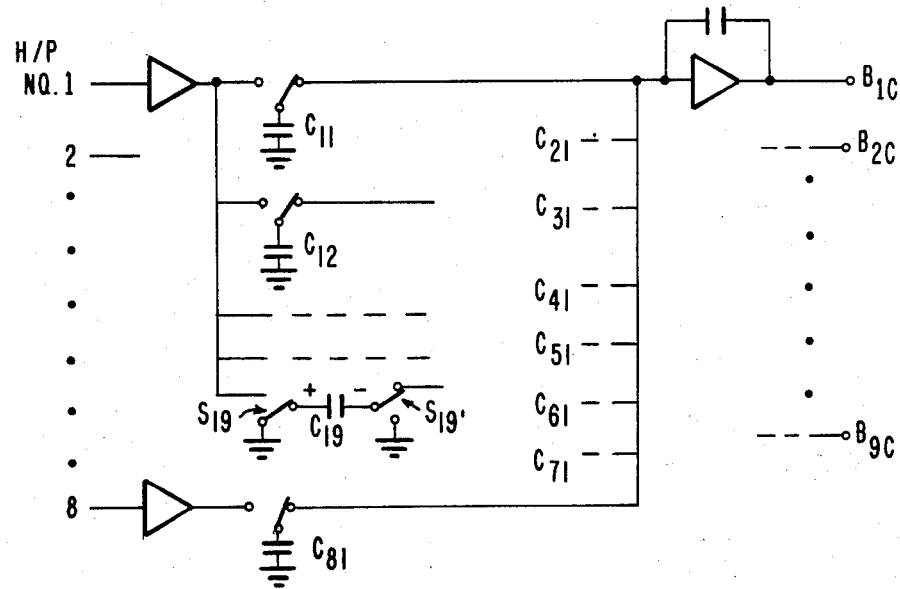
FIG. 5 is a schematic drawing of a circuit in accordance with the present invention for generating the cosine terms for nine beams for an eight element stave of a cylindrical array.

To further illustrate the present invention, a second embodiment of the invention is illustrated in FIG. 5. This figure illustrates the circuits which generate the cosine terms for nine beams formed by an eight element stave of a cylindrical transducer array, each beam steered to a predetermined angle $\phi_i$ with respect to the array axis. The input from each element, designated "H/P No. 1 . . . 8," feeds one switched capacitor for each of the nine beams; thus, input H/P No. 1 feeds switched capacitor $C_{ij}$ for beam j. The eight inputs that form the cosine component $B_{1c}$ of the first beam $B_1$ are shown in FIG. 5; the sine component $B_{1s}$ is formed in a similar circuit (not shown).

For illustrative purposes, capacitor $C_{19}$ is illustrated in FIG. 5 interconnected in the sense to form a negative coefficient, sometimes utilized to form a desired beam. This requires a pair of switches $S_{19}$ which are switched in the senses shown in FIG. 5.

Nine pairs of terms $B_{is}$, $B_{ic}$ are formed and respectively summed to yield the nine beam outputs. Thus, to form the cosine terms $B_{ic}$ of nine beams, eight input operational amplifiers, nine output operational amplifiers, seventy-two switched capacitors and nine summing capacitors are required. These elements can be formed on a single LSI chip 0.200 inches square. The sine terms can be generated by circuits fabricated on a similar chip. Thus, in this example, nine beams can be generated from the outputs of eight stave transducer elements by circuits formed on two LSI chips. The stave outputs can be similarly combined in a horizontal beamformer to yield beams from the cylindrical array. This requires only one more LSI chip.

Other array geometries can also be accommodated with the present invention, although geometries comprising a replicated structure are those for which the invention achieves its greatest savings.

While the beamforming system of the present invention has been discussed in the context of an energy receiving system, the system is equally useful as an energy transmitting system, as will be apparent to those skilled in the art.

It is understood that the above-described embodiments are merely illustrative of the many possible specific embodiments which can represent applications of the principles of the present invention. Numerous and varied other arrangements can be readily devised in accordance with these principles by those skilled in the art without departing from the spirit and scope of the invention.

What is claimed is:

1. In a phase shift beamforming system adapted to form a beam directed in a predetermined direction for a signal at a predetermined signal frequency, comprising (i) a plurality of spatially disposed energy transducers providing respective transducer signals, (ii) coupling means coupled to each transducer and adapted to form first and second transducer component signals, the amplitude of the first component signal being proportional to the sine of the desired phase shift for the respective transducer and the amplitude of the second component signal being proportional to the cosine of the desired phase shift for the respective transducer, and (iii) summing means adapted to introduce a relative phase shift between the two component signals and combine such signals to provide a sum signal, the improvement wherein:

said coupling means comprises:

(i) first switched capacitor circuit means coupling such transducer to such summing means for transferring to said summing means a precise charge amplitude comprising said first component signal; and (ii) second switched capacitor circuit means coupling such transducer to such summing means for transferring to said summing means a precise charge amplitude comprising said second component signal;

said first and second circuit means being cooperativley arranged so that said charge amplitudes form a predetermined ratio; and wherein said summing means comprises means for collecting the charges transferred from said respective circuit means and coverting said charges into working voltages which may be combined to form said sum signal.

2. The improvement of claim 1 wherein said first and second switched capacitor circuits each respectively comprise MOS capacitor means and first and second MOS switched means.

3. The improvement of claim 2 wherein said first and second switched capacitor circuit means are each respectively adapted so that said capacitor means are switched between an input node and a summing node at a switch frequency to transfer charge from said respective input node to said respective summing node.

4. The improvement of claim 3 wherein said switch frequency is at least five times the signal frequency.

5. The improvement of claim 4 wherein said coupling means and said summing means are fabricated on at least one LSI circuit chip.

6. The improvement of claim 1 wherein said first switched capacitor circuit comprises first capacitor means having a first capacitance value and said second switched capacitor means comprises second capacitor means having a second capacitance value, and wherein the ratio of said first capacitance value to said second capacitance value is proportional to the tangent of such desired phase shift.

7. The improvement of claim 1 wherein each of such energy transducer has associated therewith one of said first circuit means and one of said second circuit means, and wherein said summing means comprises:

first summing circuit means coupled to each of said first circuit means and adapted to combine the charge transferred from each of said first circuit means and convert said combined charge into a working voltage comprising a composite sine component signal;

second summing circuit means coupled to each of said second circuit means and adapted to combine the charge transferred from each of said second circuit means and convert said combined charge into a working voltage comprising a composite cosine component signal; and means for combining said composite sine component signal and said composite cosine component signal to form an array beam.

8. The improvement of claim 7 wherein said second summing circuit means comprises an amplifier having a feedback capacitor means coupled from the amplifier output to its input, whereby said amplifier is adapted to phase shift said second component signals by substantially 90°.

9. A phase shift beamformer system operable on the transducer signals of an array of energy transducers to form a plurality of beams respectively steered to a predetermined direction, comprising, for each transducer:

sine circuit branch means coupled to such transducer and adapted to provide a sine component signal whose amplitude is proportional to the sine of the phase shift desired to be introduced to said transducer signal, said sine branch means comprising a first input node, a first summing node, and a first switched capacitor circuit means for transferring a precise charge amplitude comprising said sine component signal from said first input node to said first summing node;

cosine circuit branch means coupled to such transducer and adapted to provide a cosine component signal whose amplitude is proportional to the cosine of said desired phase shift, said cosine branch means comprising a second input node, a second summing node and a second switched capacitor circuit means for transferring a precise charge amplitude comprising said cosine component signal from said second input node to said second summing node;

said sine circuit branch means and said cosine circuit branch means being adapted such that the ratio of said sine component signal to said cosine component signal is substantially proportional to the tangent of said desired phase shift; and summing means coupled to said respective first and second summing nodes for respectively collecting the charges transferred by each of the respective sine branch means and the respective cosine branch means, converting said respective collected charges into working first and second voltages to provide a composite sine signal and a composite cosine signal, introducing a predetermined relative phase shift between said respective composite signals, and summing said composite signals to provide one such beam.

10. The system of claim 9 wherein said first switched capacitor means comprises first capacitor means having a first capacitance value, and said second switched capacitor means comprises second capacitor means having a second capacitance value, and wherein the ratio of said first capacitance value to said second capacitance value is substantially proportional to the tangent of said desired phase shift.

11. The system of claim 10 wherein said first switched capacitor means comprises first switching means adapted to switch said first capacitor means between said first input node and said first summing node, and wherein said second switched capacitor means comprises second switching means adapted to switch said second capacitor means between said second input node and said second summing node.

12. The system of claim 11 wherein said first and second switching means are adapted to operate at a switching frequency substantially higher than the design signal frequency of energy induced in said transducer.

13. The system of claim 11 wherein said summing means comprises first, second and third sum circuits, said first sum circuit adapted to combine the respective sine component signals for a plurality of transducers in an array and provide a composite array sine component, and said second sum circuit is adapted to sum said cosine component signals and provide a composite array cosine component, and said third sum circuit is adapted to sum said sine and cosine composite components to provide a beam signal.

14. The system of claim 9 wherein said system further comprises for each transducer a plurality of sets of said sine and cosine circuit branches and said summing means, each of said sets adapted to provide a beam signal.

15. The system of claim 14 wherein each of said sets comprise MOS switched capacitor circuits comprising MOS capacitors and MOS transistor circuits, fabricated on at least one LSI circuit chip.

16. A phase shift beamformer system operable on the transducer signals of an array of energy transducers to form a plurality of beams respectively steered to predetermined directions, comprising, for each transducer:
  sine circuit branch means coupled to such transducer and adapted to provide a sine component signal whose amplitude is proportional to the sine of the phase shift desired to be introduced to said transducer signal, said sine branch means comprising a first input node, a first summing node, and a first switched capacitor circuit means for transferring a precise charge level comprising said sine component signal from said first input node to said first summing node;
  cosine circuit branch means coupled to such transducer and adapted to provide a cosine component signal whose amplitude is proportional to the cosine of said desired phase shift, said cosine branch means comprising a second input node, a second summing node, and a second switched capacitor circuit means for transferring a precise charge level comprising said sine component signal from said second input node to said second summing node;
  said sine circuit branch means and said cosine circuit branch means being fabricated on one or more MOS integrated circuits and wherein said first and second switched capacitor circuits each comprise MOS capacitors and MOS transistor switches, said respective sine and cosine circuit branch means being adapted such that the ratio of said sine component signal to said cosine component signal is substantially proportional to the tangent of said desired phase shift; and
  summing means coupled to said respective first and second summing nodes of sine and cosine circuit branch means for respectively collecting the charges transferred by each of the respective sine branch means and the respective cosine branch means, converting said respective collected charges into working first and second voltages to provide a composite sine signal and a composite cosine signal, introducing a predetermined relative phase shift between said respective composite signal, and summing said composite signals to provide one such beam.

* * * * *